United States Patent
Nagam et al.

(10) Patent No.: US 10,615,803 B2
(45) Date of Patent: Apr. 7, 2020

(54) COMPACT PHASE-LOCKED LOOP WITH LOW JITTER AND REFERENCE SPURS

(71) Applicant: The Trustees of Columbia University in the City of New York, New York, NY (US)

(72) Inventors: Shravan Siddartha Nagam, Nashua, NH (US); Peter R. Kinget, Summit, NJ (US)

(73) Assignee: The Trustees of Columbia University in the City of New York, New York, NY (US)

( * ) Notice: Subject to any disclaimer, the term of this patent is extended or adjusted under 35 U.S.C. 154(b) by 0 days.

(21) Appl. No.: 16/042,607

(22) Filed: Jul. 23, 2018

(65) Prior Publication Data
US 2020/0028515 A1    Jan. 23, 2020

(51) Int. Cl.
| H03K 3/03 | (2006.01) |
| H03L 7/087 | (2006.01) |
| H03L 7/091 | (2006.01) |
| H03L 7/08 | (2006.01) |
| H03K 5/00 | (2006.01) |
| H03L 7/099 | (2006.01) |

(52) U.S. Cl.
CPC ......... *H03L 7/0802* (2013.01); *H03K 3/0322* (2013.01); *H03K 5/00006* (2013.01); *H03L 7/087* (2013.01); *H03L 7/091* (2013.01); *H03L 7/0995* (2013.01); *H03L 2207/06* (2013.01)

(58) Field of Classification Search
CPC .... H03K 3/0315; H03K 3/0322; H03L 7/087; H03L 7/091; H03L 7/0995; H03L 2207/06

USPC .......................................................... 331/11
See application file for complete search history.

(56) References Cited

U.S. PATENT DOCUMENTS

| 4,272,729 A * | 6/1981 | Riley, Jr. | H03L 7/189 331/1 A |
| 6,803,827 B1 * | 10/2004 | Kenney | H03L 7/107 331/1 A |
| 7,486,146 B2 * | 2/2009 | Lin | H03L 7/099 331/1 A |
| 9,344,094 B2 * | 5/2016 | Waldrip | H03L 1/022 |

(Continued)

OTHER PUBLICATIONS

Arakali, Abhijith, et al., "Low-Power Supply-Regulation Techniques for Ring Oscillators in Phase-Locked Loops Using a Split-Tuned Architecture," Journal of Solid-State Circuits, vol. 44, Issue 8, Aug. 2009, pp. 2169-2181.

(Continued)

*Primary Examiner* — Levi Gannon
(74) *Attorney, Agent, or Firm* — Withrow & Terranova, P.L.L.C.

(57) ABSTRACT

The present disclosure relates to a phase-locked loop (PLL) including a frequency detector, a sub-sampling phase detector (SSPD), and a voltage-controlled oscillator (VCO). The frequency detector is configured to receive a reference signal and an output signal, and to generate a coarse-tuning voltage that indicates a frequency difference between the reference signal and the output signal. The SSPD is configured to sub-sample the output signal using the reference signal, and to generate a fine-tuning voltage that indicates a phase difference between the reference signal and the output signal. The VCO is configured to update the output signal based on the coarse-tuning voltage and the fine-tuning voltage.

21 Claims, 5 Drawing Sheets

(56) References Cited

U.S. PATENT DOCUMENTS

| | | | | |
|---|---|---|---|---|
| 9,608,644 | B1* | 3/2017 | Raj | H03L 7/087 |
| 2002/0187763 | A1* | 12/2002 | Lim | H03L 7/085 |
| | | | | 455/165.1 |
| 2003/0048139 | A1* | 3/2003 | Chien | H03L 7/099 |
| | | | | 331/11 |
| 2005/0052208 | A1* | 3/2005 | Starr | H03L 7/0812 |
| | | | | 327/156 |
| 2008/0048788 | A1* | 2/2008 | Yu | H03L 7/087 |
| | | | | 331/16 |
| 2008/0106340 | A1* | 5/2008 | Lee | H03L 7/087 |
| | | | | 331/16 |
| 2012/0056654 | A1* | 3/2012 | Lee | H03L 7/083 |
| | | | | 327/159 |
| 2016/0065225 | A1* | 3/2016 | Pavao-Moreira | H03L 7/099 |
| | | | | 331/16 |
| 2017/0244416 | A1* | 8/2017 | Lakshmikumar | H03L 7/0807 |

OTHER PUBLICATIONS

Chen, Zuow-Zun, et al., "Sub-Sampling All-Digital Fractional-N Frequency Synthesizer with -111dBc/Hz In-Band Phase Noise and an FOM of -242dB," International Solid-State Circuits Conference, Feb. 2015, 3 pages.

Chuang, Jeffrey, et al., "A 0.0049mm2 2.3GHz Sub-Sampling Ring-Oscillator PLL with Time-Based Loop Filter Achieving -236.2dB Jitter-FOM," IEEE International Solid-State Circuits Conference, Feb. 2017, pp. 328-330.

Gao, Xiang, et al., "A Low Noise Sub-Sampling PLL in Which Divider Noise is Eliminated and PD/CP Noise is Not Multiplied by N2," IEEE Journal of Solid-State Circuits, vol. 44, Issue 12, Dec. 2009, pp. 3253-3263.

Gao, Xiang, et al., "Spur Reduction Techniques for Phase-Locked Loops Exploiting A Sub-Sampling Phase Detector," IEEE Journal of Solid-State Circuits, vol. 45, Issue 9, Sep. 2010, pp. 1809-1821.

Gao, Xiang, et al., "Sub-Sampling PLL Techniques," Custom Integrated Circuits Conference, Sep. 2015, IEEE, 8 pages.

Gardner, Floyd, "Phaselock Techniques," 3rd Edition, John Wiley & Sons, Inc., 2005, Hoboken, New Jersey, 443 pages.

Hsu, et al., "A Sub-Sampling-Assisted Phase-Frequency Detector for Low-Noise PLLs With Robust Operation Under Supply Interference," IEEE Transactions on Circuits and Systems, vol. 62, Issue 1, Jan. 2015, pp. 90-99.

Huang, Zhiqiang, et al., "A 4.2us-Settling-Time 3rd-Order 2.1GHz Phase-Noise-Rejection PLL Using a Cascaded Time-Amplified Clock-Skew Sub-Sampling DLL," International Solid-State Circuits Conference, Jan. 2016, IEEE, pp. 40-42.

Kong, L., et al., "A 2.4GHz 4mW Inductorless RF synthesizer," IEEE International Solid-State Circuits Conference, Feb. 2015, 3 pages.

Kong, L., et al., "A 2.4GHz mW Integer-N Inductorless RF Synthesizer," IEEE Journal of Solid-State Circuits, 2015, 10 pages.

Nagam, S.S., et al., "A 0.008mm2 2.4GHz Type-I Sub-Sampling Ring-Oscillator-based Phase-Locked Loop with a -239.7dB FoM and -64dBc Reference Spurs," Custom Integrated Circuits Conference, Apr. 2018, 4 pages.

Nagam, S.S., et al., "A -236.3dB FoM Sub-Sampling Low-Jitter Supply-Robust Ring-Oscillator PLL for Clocking Applications with Feed-Forward Noise Cancellation," Custom Integrated Circuits Conference, May 2017, IEEE, 4 pages.

Raczkowski, Kuba, et al., "A 9.2-12.7 GHz Wideband Fractional-N Subsampling PLL in 28nm CMOS With 280 fs RMS Jitter," IEEE Radio Frequency Integrated Circuits Symposium, 2014, pp. 89-92.

Raj, Mayank, et al., "A 164fsrms 9-to-18GHz Sampling Phase Detector based PLL with In-Band Noise Suppression and Robust Frequency Acquisition in 16nm FinFET," Digest of Technical Papers Symposium on VLSI Circuits, Jun. 2017, pp. C182-C183.

Siriburanan, Teerachot, et al., "A 2.2 GHz-242dB-FOM 4.2mW ADC-PLL Using Digital Sub-Sampling Architecture," International Solid-State Circuits Conference, Feb. 2015, 3 pages.

Sogo, Kenta, et al., "A Ring-VCO-Based Sub-Sampling PLL CMOS Circuit with -119 dBc/Hz Phase Noise and 0.73 ps Jitter," European Solid-State Circuits Conference, Sep. 2012, pp. 253-256.

Yi, Xiang, et al., "A Low Phase Noise 24/77 GHz Dual-Band Sub-Sampling PLL for Automotive Radar Applications in 65 nm CMOS Technology," Asian Solid-State Circuits Conference, Nov. 2013, IEEE, pp. 417-420.

Zhu, Junheng, et al., "A 0.0021mm2 1.82mW 2.2GHz PLL Using Time-Based Integral Control in 65nm CMOS," IEEE International Solid-State Circuits Conference, Jan. 2016, pp. 338-340.

* cited by examiner

COMPACT PHASE-LOCKED LOOP WITH LOW JITTER AND REFERENCE SPURS

FIELD OF THE DISCLOSURE

The present disclosure relates to a phase-locked loop (PLL), and more particularly to a compact PLL with low jitter and reference spurs.

BACKGROUND

Phase-locked loops (PLLs) are essential parts of practically all of today's electronic systems like wireless transceivers, data converters, or digital systems. The main PLL performance metrics are area consumption, tuning range, and jitter performances. In a modern electronic system, many PLLs need to be integrated, such that area consumption, tuning range, and jitter performances of PLLs are also critical to the system.

From area and tuning range perspectives, ring oscillator (RO) based PLLs are more attractive than inductor-capacitor (LC) oscillator based PLLs, since the RO based PLLs avoid large on-chip inductors. However, RO based PLLs tend to have poor jitter or noise performance. The jitter of a PLL can be broadly classified as a random jitter (RJ) that arises from device noise and manifests itself as phase-noise side bands around the carrier, and a deterministic jitter (DJ) that arises due to periodic disturbances from the reference clock and manifests itself as reference spurs.

To reduce the total jitter (both the phase noise and reference spurs) and to utilize the area and tuning range advantages of a RO based PLL, it is therefore an object of the present disclosure to provide a compact PLL design with better jitter performances. Further, there is also a need for the final product to have low power consumption.

SUMMARY

The present disclosure relates to a phase-locked loop (PLL) including a frequency detector, a controlled slope buffer, a sub-sampling phase detector (SSPD), a voltage-controlled oscillator (VCO), and a frequency divider. The frequency divider is configured to receive an output signal and generate a divided signal by frequency dividing the output signal with a frequency divide ratio. The frequency detector is configured to receive a reference signal and the divided signal, and generate a coarse-tuning voltage that indicates a frequency difference between the reference signal and the divided signal. The controlled slope buffer is configured to receive the divided signal and generate a buffered divided signal. Herein, the buffered divided signal and the divided signal have a same frequency, and the buffered divided signal has a higher slope and shorter rising time than the divided signal. The SSPD is configured to sub-sample the buffered divided signal using the reference signal, and generate a fine-tuning voltage that indicates a phase difference between the reference signal and the buffered divided signal. The VCO is configured to tune the output signal based on the coarse-tuning voltage and the fine-tuning voltage.

In one embodiment of the PLL, the frequency divide ratio is 2.

In one embodiment of the PLL, the VCO is a ring oscillator having a coarse-tuning port and a fine-tuning port, and includes a number of pseudo-differential delay stages, which are coupled in series as a closed cycle.

In one embodiment of the PLL, each pseudo-differential delay stage has a positive input terminal, a negative input terminal, a positive output terminal, a negative output terminal, and a control terminal. Herein, the positive input terminal and the negative input terminal of one of the pseudo-differential delay stages are coupled to the positive output terminal and the negative output terminal of an adjacent one of the pseudo-differential delay stages, respectively. The control terminal of each pseudo-differential delay stage is coupled to the coarse-tuning port or the fine-tuning port.

In one embodiment of the PLL, the pseudo-differential delay stages includes first pseudo-differential delay stages and second pseudo-differential delay stages. The control terminal of each first pseudo-differential delay stage is coupled to the coarse-tuning port, and the control terminal of each second pseudo-differential delay stage is coupled to the fine-tuning port.

According to another embodiment, the PLL further includes a switch coupled between the SSPD and the VCO. When the switch is open, the SSPD is disconnected from the VCO, and the fine-tuning port receives a direct current (DC) voltage. When the switch is closed, the SSPD is connected to the VCO, and the fine-tuning port receives the fine-tuning voltage. The coarse-tuning port receives the coarse-tuning voltage.

In one embodiment of the PLL, the frequency detector includes a compensate frequency divider, a frequency controller, a digital-to-analog converter (DAC), and a DAC capacitor. Herein, the compensate frequency divider divides the divided signal to generate a fully divided signal fed to the frequency controller. The frequency controller is configured to compare the fully divided signal with the reference signal to generate frequency error codes to control the DAC. The DAC is configured to provide the coarse-tuning voltage based on the frequency error codes. The DAC capacitor is coupled between the DAC and ground to minimize the noise from resistors inside the DAC.

In one embodiment of the PLL, the DAC capacitor is a metal-oxide-semiconductor (MOS) capacitor.

In one embodiment of the PLL, the DAC capacitor has a capacitance between 0.5 pF and 2 pF.

In one embodiment of the PLL, the frequency controller is off-chip.

In one embodiment of the PLL, the frequency controller is on-chip.

In one embodiment of the PLL, the controlled slope buffer is a current-starved delay stage including a current source, a first P-type metal-oxide-semiconductor (PMOS) transistor, a second PMOS transistor, a third PMOS transistor, a NMOS transistor, and a buffer capacitor. The current source is coupled between a drain of the first PMOS transistor and ground. Sources of the first PMOS transistor and the second PMOS transistor are coupled to a supply voltage, and gates of the first PMOS transistor and the second PMOS transistor are coupled together. A drain of the second PMOS transistor is coupled to a source of the third PMOS transistor. Gates of the third PMOS transistor and the NMOS transistor are coupled together and configured to receive the divided signal. Drains of the third PMOS transistor and the NMOS transistor are coupled together and configured to provide the buffered divided signal. A source of the NMOS transistor is coupled to ground, and the buffer capacitor is coupled between the drain of the NMOS and ground.

In one embodiment of the PLL, the second PMOS transistor is a size variable transistor.

In one embodiment of the PLL, the SSPD includes a first switch, a first capacitor with a first capacitance, a unit-gain buffer, a non-overlap generator, a second switch, and a second capacitor with a second capacitance. Herein, the first switch is configured to sub-sample the buffered divided signal onto the first capacitor providing a sampled voltage, and the first switch is controlled by the reference signal. The unit-gain buffer is configured to receive the sampled voltage and generate a buffered sampled voltage. The non-overlap generator is configured to generate a non-overlap clock based on the reference signal. The non-overlap clock and the reference signal have a same frequency and are never overlapped. The second switch is configured to sample the buffered sampled voltage onto the second capacitor providing the fine-tuning voltage, and the second switch is controlled by the non-overlap clock.

In one embodiment of the PLL, the unit-gain buffer is formed by an operational amplifier (op-amp).

In one embodiment of the PLL, the non-overlap generator is configured to generate an inverted reference signal and a delayed reference signal from the reference signal, and combine the inverted reference signal with the delayed reference signal to provide the non-overlap clock. The inverted reference signal and the delayed reference signal have a same frequency as the reference signal. The inverted reference signal has an opposite phase to the reference signal, and the delayed reference signal has a delayed phase compared to the reference signal.

In one embodiment of the PLL, the first capacitance is between 50 fF and 100 fF, and the second capacitance is between 2 pF and 3 pF.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

Figure 1:
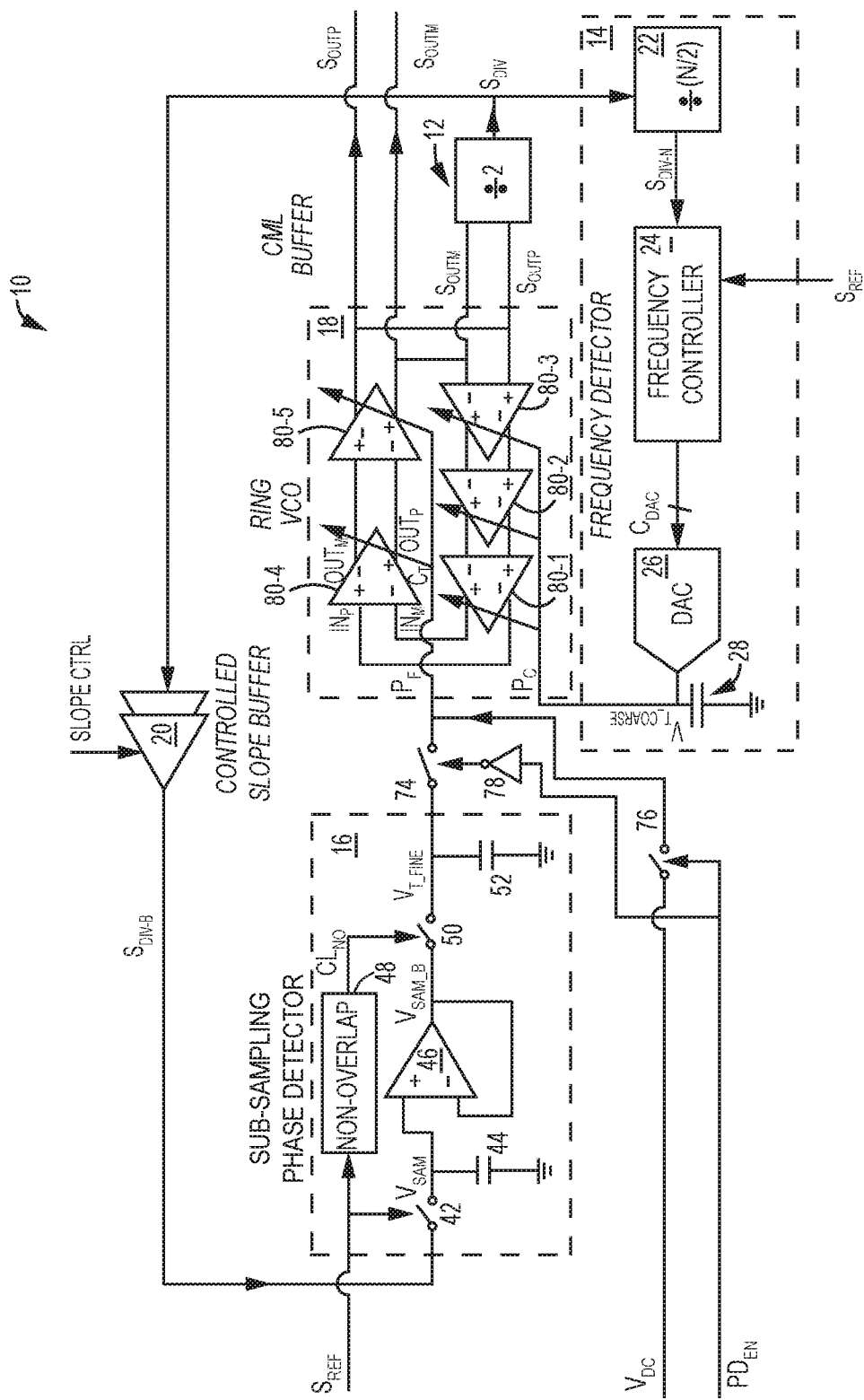
FIG. 1 shows an exemplary phase-locked loop (PLL) according to one embodiment of the present disclosure.

It will be understood that for clear illustrations, FIGS. 1-3C may not be drawn to scale.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

The present disclosure relates to a compact phase-locked loop (PLL), with low jitter and reference spurs. FIG. 1 shows an exemplary PLL 10 according to one embodiment of the present disclosure. The PLL 10 is configured to receive a reference signal $S_{REF}$ with a reference frequency $f_{REF}$, and provide output signals $S_{OUTP}$ and $S_{OUTM}$. The output signals $S_{OUTP}$ and $S_{OUTM}$ are a pair of differential signals with a same output frequency $f_{OUT}$ and opposite phases (180° degree difference). The reference signal $S_{REF}$ may be provided by a crystal oscillator (not shown). The reference frequency $f_{REF}$ is constant and associated with a desired output frequency $f_{OUT\_D}$ of the output signals $S_{OUTP}$ and $S_{OUTM}$. The PLL 10 includes a frequency divider 12, a frequency detector 14, a sub-sampling phase detector (SSPD) 16, and a voltage-controlled oscillator (VCO) 18. The frequency divider 12, the frequency detector 14, and the VCO 18 form a frequency lock loop, while the frequency divider 12, the sub-sampling phase detector (SSPD) 16, and the VCO 18 form a sub-sampling loop. The PLL 10 is a Type-I PLL that only includes one integrator (the VCO 18) in the loop and avoids a large area-consuming integrating capacitor present in a loop filter.

In detail, the frequency divider 12 is configured to receive the output signals $S_{OUTP}$ and $S_{OUTM}$, and provide a divided signal $S_{DIV}$ to the frequency detector 14 and the SSPD 16. In some applications, the PLL 10 may further include a controlled slope buffer 20 coupled between the frequency divider 12 and the SSPD 16, such that the divided signal $S_{DIV}$ is buffered by the controlled slope buffer 20 to generate a buffered divided signal $S_{DIV\_B}$ for the SSPD 16. The frequency detector 14 is configured to compare the divided signal $S_{DIV}$ with the reference signal $S_{REF}$, and generate a coarse-tuning voltage $V_{T\_COARSE}$, which indicates a frequency difference between the reference signal $S_{REF}$ and the divided signal $S_{DIV}$. The SSPD 16 is configured to compare the buffered divided signal $S_{DIV\_B}$ with the reference signal $S_{REF}$, and generate a fine-tuning voltage $V_{T\_FINE}$, which indicates a phase difference between the reference signal $S_{REF}$ and the buffered divided signal $S_{DIV\_B}$. The coarse-tuning voltage $V_{T\_COARSE}$ is fed to a coarse-tuning port $P_C$ of the VCO 18, and the fine-tuning voltage $V_{T\_FINE}$ is fed to a fine-tuning port $P_F$ of the VCO 18. The VCO 18 is configured to adjust the output signals $S_{OUTP}$ and $S_{OUTM}$ based on the coarse-tuning voltage $V_{T\_COARSE}$ and the fine-tuning voltage $V_{T\_FINE}$. Once the PLL 10 is locked, the output frequency $f_{OUT}$ of the output signal $S_{OUTP}/S_{OUTM}$ achieves the desired value corresponding to the reference frequency $f_{REF}$ of the reference signal $S_{REF}$.

Herein, the frequency divider 12 may utilize different divide ratios from 1 to $N=(f_{OUT\_D}/f_{REF})$, once the divided signal $S_{DIV}$ has a frequency integer times of the reference frequency $f_{REF}$. From power consuming and design complexity perspectives, the frequency divider 12 is desired to have a divide ratio 2. In some applications, the frequency divider 12 may be omitted, such that the output frequency $f_{OUT}$ will not be divided before fed to the frequency detector 14 and the SSPD 16.

The frequency detector 14 includes a compensate frequency divider 22, a frequency controller 24, a digital-to-analog converter (DAC) 26, and a DAC capacitor 28. The compensate frequency divider 22 further divides the divided signal $S_{DIV}$ to generate a fully divided signal $S_{DIV\_N}$ with a fully divided frequency $f_{DIV\_N}$ fed to the frequency controller 24. The divide ratio of the compensate frequency divider 22 is N/M, where M is the divide ratio of the frequency divider 12, $N=f_{OUT\_D}/f_{REF}$, and N/M is an integer number. As such, a combination of the compensate frequency divider 22 and the frequency divider 12 achieves a combined divide ratio $N=f_{OUT\_D}/f_{REF}$.

The frequency controller 24 is configured to compare the fully divided signal $S_{DIV\_N}$ with the reference signal $S_{REF}$ to determine frequency errors. In some applications, the frequency controller 24 may be off-chip for testing flexibility, and in some applications, the frequency controller 24 may be realized on-chip with negligible area and power consumption. Based on the frequency errors between the fully divided signal $S_{DIV\_N}$ and the reference signal $S_{REF}$, the frequency controller 24 generates frequency error codes $C_{DAC}$ to control the DAC 26 that drives the coarse-tuning port $P_C$ of the VCO 18. If the VCO 18 is a negative proportional characteristic VCO (refers to a VCO having a negative proportional characteristic between an input voltage and an output frequency), when the divided frequency $f_{DIV\_N}$ is higher than the reference frequency $f_{REF}$, the frequency error codes $C_{DAC}$ will increase; when the divided frequency $f_{DIV\_N}$ is lower than the reference frequency $f_{REF}$, the frequency error codes $C_{DAC}$ will decrease. If the VCO 18 is a positive proportional characteristic VCO (refers to a VCO having a positive proportional characteristic between an input voltage and an output frequency), when the divided frequency $f_{DIV\_N}$ is higher than the reference frequency $f_{REF}$, the frequency error codes $C_{DAC}$ will decrease; when the divided frequency $f_{DIV\_N}$ is lower than the reference frequency $f_{REF}$, the frequency error codes $C_{DAC}$ will increase.

Based on the frequency error codes $C_{DAC}$, the DAC 26 is configured to provide the coarse-tuning voltage $V_{T\_COARSE}$ to the coarse-tuning port $P_C$ of the VCO 18. Herein, the DAC 26 may be a 5-bit DAC. In different applications, the DAC 26 may have different resolutions. The DAC capacitor 28 is placed between an output port of the DAC 26 and ground to minimize the noise from resistors inside the DAC 26. The DAC capacitor 28 may be realized as a metal-oxide-semiconductor (MOS) capacitor with a capacitance between 0.5 pF and 2 pF. A leakage current of the DAC capacitor 28 does not introduce reference spurs into the PLL 10, because the leakage current of the DAC capacitor 28 results in a small direct current (DC) offset in the coarse-tuning voltage $V_{T\_COARSE}$, but does not introduce a periodic disturbance.

Figure 2:
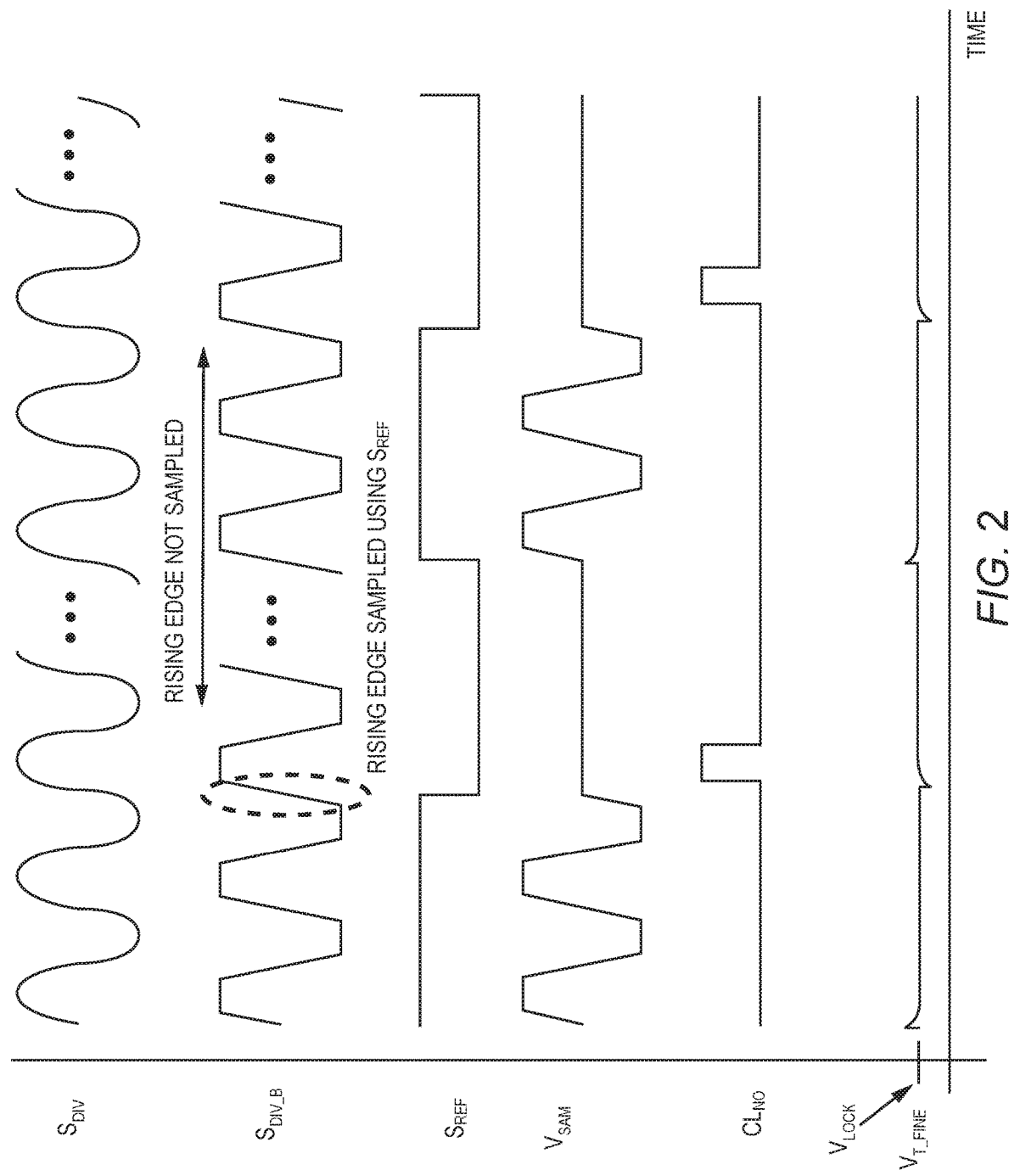
FIG. 2 illustrates timing diagrams of the PLL illustrated in FIG. 1.

The controlled slope buffer 20 is configured to receive the divided signal $S_{DIV}$ from the frequency divider 12, and provide the buffered divided signal $S_{DIV\_B}$ to the SSPD 16. Typically, the differential output signals $S_{OUTP}$ and $S_{OUTM}$ from the VCO 18, and the single divided signal $S_{DIV}$ from the frequency divider 12 are sin/cos wave signals, which have a relatively low slope and relatively long rising time. In order to obtain a superior gain of the SSPD 16 and a wide bandwidth (BW) of the sub-sampling loop (depending on the slope of an input signal of the SSPD 16), the controlled slope buffer 20 is configured to increase the slope of the divided signal $S_{DIV}$ and decrease the rising time of the divided signal $S_{DIV}$. As illustrated in FIG. 2, the buffered divided signal $S_{DIV\_B}$ has a higher slope and shorter rising time than the divided signal $S_{DIV}$. In some applications, the controlled slope buffer 20 may be omitted, such that the divided signal $S_{DIV}$ will be directly fed to the SSPD 16.

Figure 3A:
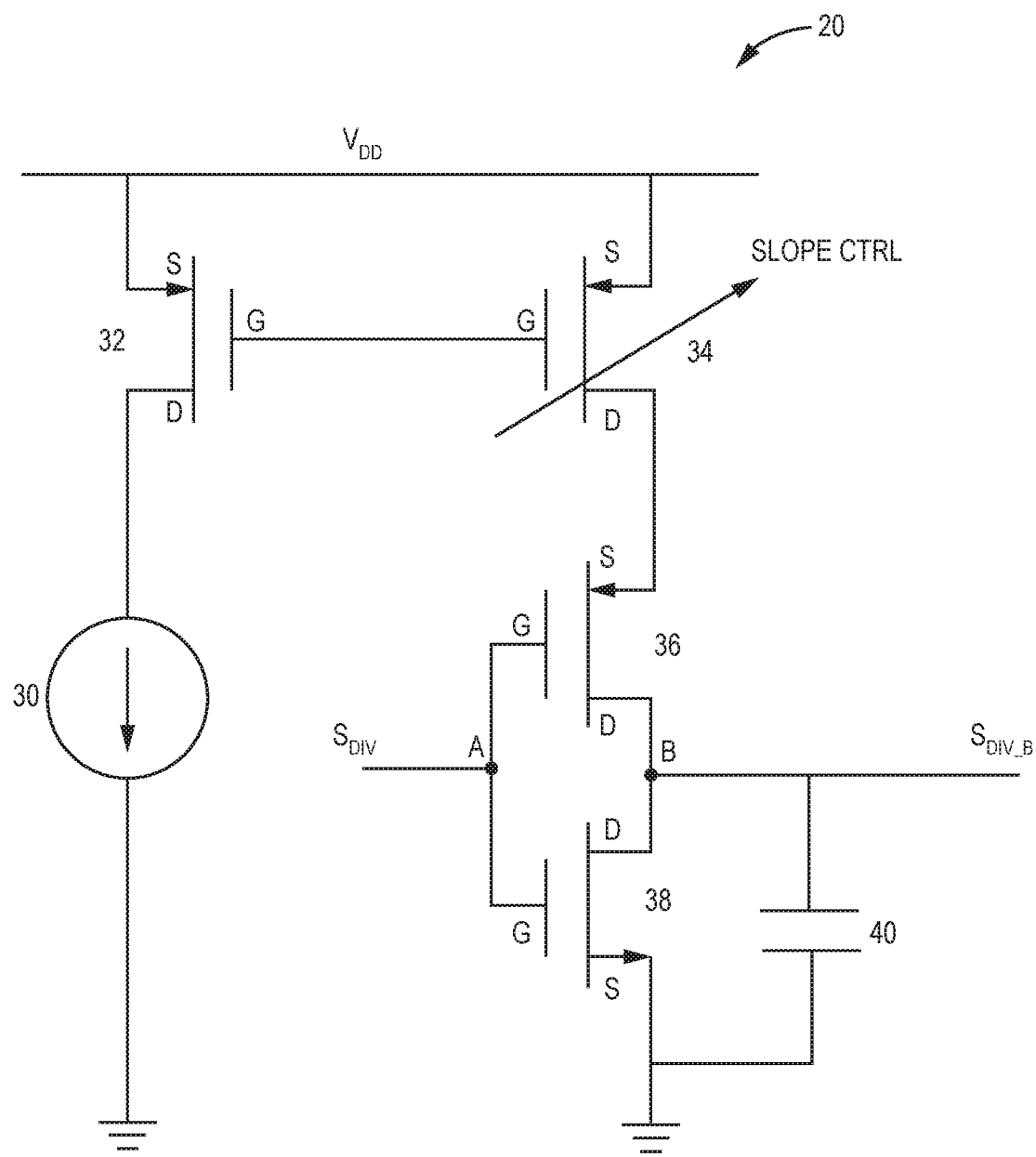
FIGS. 3A-3C show transistor level details of circuitries within the PLL illustrated in FIG. 1.

In one embodiment, the controlled slope buffer 20 may be realized as a current-starved delay stage, as illustrated in FIG. 3A. The controlled slope buffer 20 may include a current source 30, a first P-type metal-oxide-semiconductor (PMOS) transistor 32, a second PMOS transistor 34, a third PMOS transistor 36, a first NMOS transistor 38, and a buffer capacitor 40. The current source 30 is coupled between a drain of the first PMOS transistor 32 and ground with a current from the first PMOS transistor 32 to ground. A source of the first PMOS transistor 32 is coupled to a supply voltage $V_{DD}$, and a gate of the first PMOS transistor 32 is coupled to the second PMOS transistor 34. A source of the second PMOS transistor 34 is coupled to the supply voltage $V_{DD}$, and a drain of the second PMOS transistor 34 is coupled to the third PMOS transistor 36. Gates of the third PMOS transistor 36 and the first NMOS transistor 38 are coupled together at point A, and configured to receive the divided signal $S_{DIV}$. Drains of the third PMOS transistor 36 and the first NMOS transistor 38 are coupled together at point B, and configured to provide the buffered divided signal $S_{DIV\_B}$. A source of the first NMOS transistor 38 is coupled to ground, and the buffer capacitor 40 is coupled between the point B and ground.

The second PMOS transistor 34 is a size variable transistor controlled in a binary fashion using slope control bits. By change the value of the slope control bits, the size (width to length ratio) of the second PMOS transistor 34 will change and hence the current through the second PMOS transistor 34 will change. For instance, if the slope control bits are "000", the size of the second PMOS transistor 34 may be one unit element size with (W/L) 12 μm/60 nm. If the slope control bits are "001", the size of the second PMOS transistor 34 may be two unit elements size with (W/L) (12 μm+12 μm)/60 nm. Herein, the slope (rising time) of the buffered divided signal $S_{DIV\_B}$ depends upon the size (width to length ratio) of the second PMOS transistor 34. The larger the size (width to length ratio) of the second PMOS transistor 34, the higher the slope of the buffered divided signal $S_{DIV\_B}$ (shorter is the rising time of the buffered divided signal $S_{DIV\_B}$) and vice versa. Note that the divided signal $S_{DIV}$ received by the controlled slope buffer 20 and the buffered divided signal $S_{DIV\_B}$ provided by the controlled slope buffer 20 have a same frequency.

The SSPD 16 sub-samples the buffered divided signal $S_{DIV\_B}$ and derives the fine-tuning voltage $V_{T\_FINE}$ to the fine-tuning port $P_F$ of the VCO 18. The SSPD 16 includes a first switch 42, a first capacitor 44 with a first capacitance C1, a unit-gain buffer 46, a non-overlap generator 48, a second switch 50, and a second capacitor 52 with a second capacitance C2. The buffered divided signal $S_{DIV\_B}$ is sub-sampled by the first switch 42 onto the first capacitor 44 to provide a sampled voltage $V_{SAM}$, as illustrated in FIG. 2. The first switch 42 is controlled to be open or closed by the reference signal $S_{REF}$. Herein, when the reference signal $S_{REF}$ is high, the first switch 42 is closed and the buffered divided signal $S_{DIV\_B}$ is passed through the first switch 42 to charge/discharge the first capacitor 44. When the reference signal $S_{REF}$ is low, the first switch 42 is open and the buffered divided signal $S_{DIV\_B}$ is blocked by the first switch 42.

Note that only one rising edge of the buffered divided signal $S_{DIV\_B}$ gets sampled every cycle of the reference signal $S_{REF}$. Other rising edges of the buffered divided signal $S_{DIV\_B}$ within one cycle of the reference signal $S_{REF}$ do not get sampled and may be eliminated without any effect on the sampled voltage $V_{SAM}$. Therefore, the signals with a same slope (with a same or different harmonic frequency) may be used as the input signal to the SSPD 16 for a same output. As such, the input signal to the SSPD 16 is not required to have a same frequency as the output signals $S_{OUTP}$ and $S_{OUTM}$. A divided version of the output signals $S_{OUTP}$ and $S_{OUTM}$, like the buffered divided signal $S_{DIV\_B}$, may be used as the input signal to the SSPD 16. Since the buffered divided signal $S_{DIV\_B}$ has a lower frequency than the output signals $S_{OUTP}$ and $S_{OUTM}$, like half of the output frequency $f_{OUT}$, the power consumption of the SSPD 16 significantly reduces.

The sampled voltage $V_{SAM}$ is fed to the unit-gain buffer 46 to generate a buffered sampled voltage $V_{SAM\_B}$. The unit-gain buffer 46 may be realized by an operational amplifier (op-amp). A positive input terminal of the unit-gain buffer 46 receives the sampled voltage $V_{SAM}$, and a negative input terminal of the unit-gain buffer 46 is shorted to an output terminal of the unit-gain buffer 46, at which the buffered sampled voltage $V_{SAM\_B}$ is provided. The buffered sampled voltage $V_{SAM\_B}$ is further sampled by the second switch 50 onto the second capacitor 52 to provide the fine-tuning voltage $V_{T\_FINE}$. The second switch 50 is controlled to be open or closed by a non-overlap clock $CL_{NO}$ generated from the reference signal $S_{REF}$ by the non-overlap generator 48. When the non-overlap clock $CL_{NO}$ is high, the second switch 50 is closed and the buffered sampled voltage $V_{SAM\_B}$ is passed through the second switch 50 onto the second capacitor 52. When the non-overlap clock $CL_{NO}$ is low, the second switch 50 is open and the buffered sampled voltage $V_{SAM\_B}$ is blocked by the second switch 50. Herein, the non-overlap clock $CL_{NO}$ has a same frequency (the reference frequency $f_{REF}$) as the reference signal $S_{REF}$, and is never overlapped with the reference signal $S_{REF}$, as illustrated in FIG. 2. Herein, the non-overlap clock $CL_{NO}$ is never overlapped with the reference signal $S_{REF}$ refers that the non-overlap clock $CL_{NO}$ will not go high until the reference signal $S_{REF}$ goes back to low. The rising and falling edges of the non-overlap clock $CL_{NO}$ and the reference signal $S_{REF}$ do not occur at the same time. As such, the second switch 50 will only be closed when the first switch 42 is open.

Figure 3B:
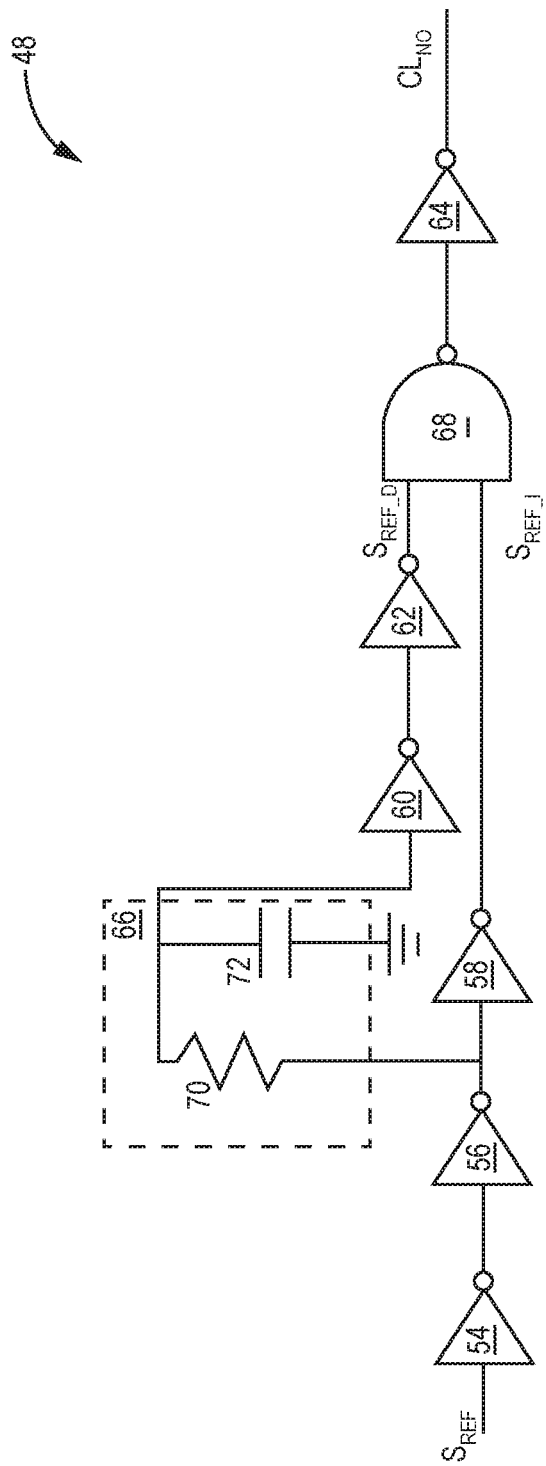

One exemplary implementation of the non-overlap generator 48 is illustrated in FIG. 3B. The non-overlap generator 48 includes a first inverter 54, a second inverter 56, a third inverter 58, a fourth inverter 60, a fifth inverter 62, a sixth inverter 64, a resistor-capacitor (RC) delay stage 66, and a NAND gate 68. In detail, the reference signal $S_{REF}$ passes through the first, second and third inverters 54, 56, and 58 successively to obtain an inverted reference signal $S_{REF\_I}$. In addition, the reference signal $S_{REF}$ also passes through the first inverter 54, the second inverter 56, the RC delay stage 66, the fifth inverter 62, and the sixth inverter 64 successively to obtain a delayed reference signal $S_{REF\_D}$. The RC delay stage 66 includes a resistor 70 and a third capacitor 72. The resistor 70 is coupled in series between the second inverter 56 and the fourth inverter 60. The third capacitor 72 is coupled between ground and a joint point of the resistor 70 and the fourth inverter 60. The inverted reference signal $S_{REF\_I}$ and the delayed reference signal $S_{REF\_D}$ have a same frequency as the reference signal $S_{REF}$. The inverted reference signal $S_{REF\_I}$ has an opposite phase to the reference signal $S_{REF}$, and the delayed reference signal $S_{REF\_D}$ has a delayed phase compared to the reference signal $S_{REF}$. The inverted reference signal $S_{REF\_I}$ and the delayed reference signal $S_{REF\_D}$ are fed to input terminals of the NAND gate 68 to generate the non-overlap clock $CL_{NO}$ through the sixth inverter 64. Since the non-overlap generator 48 produces the non-overlap clock $CL_{NO}$ in an open loop fashion, it does not affect the noise performance of reference signal $S_{REF}$.

If the sampled voltage $V_{SAM}$ is directly sampled by the second switch 50 onto the second capacitor 52, there may be charge sharing between the first capacitor 44 and the second capacitor 52, which may introduce a low-pass transfer function with a pole frequency proportional to a capacitance ratio C1/C2. To increase the pole frequency beyond a loop BW of the PLL 10, a high capacitance ratio C1/C2 is desired. If the first capacitance C1 increases, the power consumption of the SSPD 16 will go up. If the second capacitance C2 decreases, a periodic disturbance may be introduced in the fine-tuning voltage $V_{T\_FINE}$, which results in reference spurs of the PLL 10. The unit-gain buffer 46 between the first capacitor 44 and the second capacitor 52 avoids the charge sharing between the first capacitor 44 and the second capacitor 52. Herein, the BW of the unit-gain buffer 46 is desired to be higher (at least four times higher) than the loop BW of the PLL 10 to avoid phase margin degradation. With the introduction of the unit-gain buffer 46, the first capacitance C1 of the first capacitor 44 may be between 50 fF and 100 fF. And the second capacitance C2 of the second capacitor 52 may be between 2 pF and 3 pF to minimize the reference spurs.

In some applications, the PLL 10 may further include a third switch 74, a fourth switch 76, and a seventh inverter 78. The third switch 74 is configured to connect/disconnect the VCO 18 to/from the SSPD 16, and the fourth switch 76 is configured to connect/disconnect the VCO 18 to/from a direct current (DC) voltage $V_{DC}$. Herein, the DC voltage $V_{DC}$ is half of the supply voltage $V_{DD}$, for instance, if the supply voltage $V_{DD}$=1.2V, the DC voltage $V_{DC}$=0.6V. At start-up, a phase detector enable signal $PD_{EN}$ is configured to open the third switch 74 (though the seventh inverter 78), such that the SSPD 16 is disconnected from the fine-tuning port $P_F$ of the VCO 18; and is configured to close the fourth switch 76, such that the DC voltage $V_{DC}$ is applied to the fine-tuning port $P_F$ of the VCO 18. Once the frequency detector 14 provides the coarse-tuning voltage $V_{T\_COARSE}$ to the coarse-tuning port $P_C$ of the VCO 18, the phase detector enable signal $PD_{EN}$ is configured to close the third switch 74 (through the seventh inverter 78), such that the SSPD 16 is connected to the fine-tuning port $P_F$ of the VCO 18; and is configured to open the fourth switch 76, such that the DC voltage $V_{DC}$ is disconnected from the fine-tuning port $P_F$ of the VCO 18. The fine-tuning voltage $V_{T\_FINE}$ of the SSPD 16 settles to a constant voltage $V_{LOCK}$ and the PLL 10 is locked, as illustrated in FIG. 2.

For the purpose of this illustration, the VCO 18 is a ring oscillator (RO) with five pseudo-differential delay stages 80 coupled in series as a closed cycle. The first, second, and third pseudo-differential delay stages 80-1, 80-2, and 80-3 are controlled by the coarse-tuning port $P_C$, which is driven by the DC voltage $V_{DC}$ or the SSPD 16. The fourth and fifth pseudo-differential delay stages 80-4 and 80-5 are controlled by the fine-tuning port $P_F$, which is tuned by the frequency detector 14. In different applications, the VCO 18 may include fewer or more pseudo-differential delay stages 80 for different voltage-to frequency gains of the VCO18. The coarse-tuning port $P_C$ and/or the fine-tuning port $P_F$ may control fewer or more pseudo-differential delay stages 80.

Each pseudo-differential delay stage 80 includes five terminals: a positive input terminal $IN_P$, a negative input terminal $IN_M$, a positive output terminal $OUT_P$, a negative output terminal $OUT_M$, and a control terminal $C_T$ (only the fourth pseudo-differential delay stage 80-4 is labeled with terminals for clarity). The positive input terminal $IN_P$ and the negative input terminal $IN_P$ of one pseudo-differential delay stage 80 are coupled to the positive output terminal $OUT_P$ and the negative output terminal $OUT_M$ of an adjacent pseudo-differential delay stage 80, respectively. The control terminals $C_T$ of the first, second, and third pseudo-differential delay stages 80-1, 80-2, and 80-3 are coupled to the coarse-tuning port $P_C$ of the VCO 18. The control terminals $C_T$ of the fourth and fifth pseudo-differential delay stages 80-4 and 80-5 are coupled to the fine-tuning port $P_F$ of the VCO 18. The output signals $S_{OUTP}$ and $S_{OUTM}$ of the VCO 18 are provided at the positive output terminal $OUT_P$ and the negative output terminal $OUT_M$ of the fifth pseudo-differential delay stages 80-5, respectively.

Figure 3C:
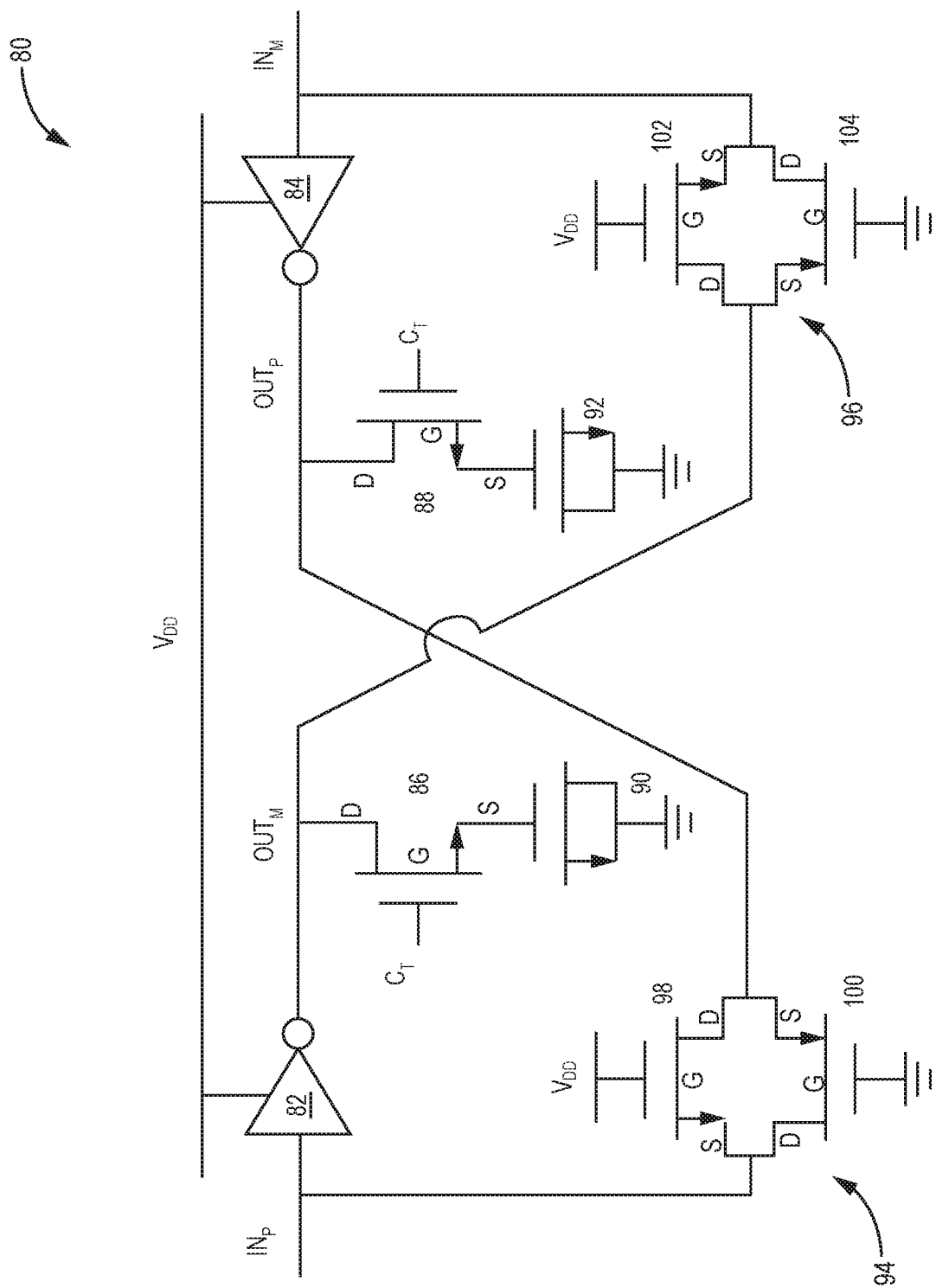

One exemplary implementation of the pseudo-differential delay stage 80 is illustrated in FIG. 3C. The pseudo-differential delay stage 80 includes an eighth inverter 82, a ninth inverter 84, a second NMOS 86, a third NMOS 88, a fourth capacitor 90, a fifth capacitor 92, a first transmission gate 94, and a second transmission gate 96. Both the eighth and ninth inverters 82 and 84 are powered by the supply voltage $V_{DD}$. The eighth inverter 82 is coupled between the positive input terminal $IN_P$ and the negative output terminal $OUT_M$, and the ninth inverter 84 is coupled between the negative input terminal $IN_M$ and the positive output terminal $OUT_P$. In one embodiment, the eighth inverter 82 (the ninth inverter 84) may be formed by a PMOS transistor with W/L 16 μm/0.2 μm and a NMOS transistor with W/L 8 μm/0.2 μm to minimize noise.

The fourth capacitor 90 and the fifth capacitor 92 may be realized as MOS capacitors. A drain of the second NMOS 86 is coupled to the negative output terminal $OUT_M$, and the fourth capacitor 90 is coupled between a source of the second NMOS 86 and ground. A gate of the second NMOS transistor 86 is coupled to the control terminal $C_T$ receiving the coarse-tuning voltage $V_{T\_COARSE}$, the fine-tuning voltage $V_{T\_FINE}$, or the DC voltage $V_{DC}$. A drain of the third NMOS transistor 88 is coupled to the positive output terminal $OUT_P$, and the fifth capacitor 92 is coupled between a source of the third NMOS 88 and ground. A gate of the third NMOS 88 is coupled to the control terminal $C_T$ receiving the coarse-tuning voltage $V_{T\_COARSE}$, the fine-tuning voltage $V_{T\_FINE}$, or the DC voltage $V_{DC}$.

The first transmission gate 94 is coupled between the positive input terminal $IN_P$ and the positive output terminal $OUT_P$. The second transmission gate 96 is coupled between the negative input terminal $IN_M$ and the negative output terminal $OUT_M$. The first transmission gate 94 is formed by a fourth NMOS 98 and a fourth PMOS transistor 100. A drain of the fourth NMOS transistor 98 and a source of the fourth PMOS transistor 100 are connected and coupled to the positive output terminal $OUT_P$. A source of the fourth NMOS 98 and a drain of the fourth PMOS 100 are connected and coupled to the positive input terminal $IN_P$. A gate of the fourth NMOS 98 is coupled to the supply voltage $V_{DD}$, and a gate of the fourth PMOS 100 is coupled to ground. Similarly, the second transmission gate 96 is formed by a fifth NMOS 102 and a fifth PMOS 104. A drain of the fifth NMOS 102 and a source of the fifth PMOS 104 are connected and coupled to the negative output terminal $OUT_M$. A source of the fifth NMOS 102 and a drain of the fifth PMOS 104 are connected and coupled to the negative input terminal $IN_M$. A gate of the fifth NMOS 102 is coupled to the supply voltage $V_{DD}$, and a gate of the fifth PMOS 104 is coupled to ground.

Herein, the output frequency $f_{OUT}$ from the VCO 18 is varied with the resistances of the second and third NMOS transistors 86 and 88. The resistances of the second and third NMOS transistors 86 and 88 are controlled by their gate voltages (the coarse-tuning voltage $V_{T\_COARSE}$ or the fine-tuning voltage $V_{T\_FINE}$). The resistance variation of the second and third NMOS transistors 86 and 88 changes the RC time constant and the delay associated with each pseudo-differential delay stage 80. The coarse-tuning voltage $V_{T\_COARSE}$ from the frequency detector 14 helps to tune a center frequency of the VCO 18 for correct lock and helps to overcome the limited acquisition range associated with the SSPD 16. The fine-tuning voltage $V_{T\_FINE}$ from the SSPD 16 precisely tunes the output frequency $f_{OUT}$ in a relative narrow range (within 40 MHz) to phase lock the PLL 10.

Those skilled in the art will recognize improvements and modifications to the preferred embodiments of the present disclosure. All such improvements and modifications are considered within the scope of the concepts disclosed herein and the claims that follow.

What is claimed is:

1. A phase-locked loop (PLL) comprising:
a frequency divider, which is configured to receive an output signal and generate a divided signal by frequency dividing the output signal with a frequency divide ratio;
a frequency detector, which is configured to receive a reference signal and the divided signal, and generate a coarse-tuning voltage, wherein the coarse-tuning voltage indicates a frequency difference between the reference signal and the divided signal;
a controlled slope buffer configured to receive the divided signal and generate a buffered divided signal, wherein:
the buffered divided signal and the divided signal have a same frequency; and
the buffered divided signal has a higher slope and shorter rising time than the divided signal;
a sub-sampling phase detector (SSPD), which is configured to sub-sample the buffered divided signal using the reference signal, and generate a fine-tuning voltage, wherein the fine-tuning voltage indicates a phase difference between the reference signal and the buffered divided signal; and
a voltage-controlled oscillator (VCO), which is configured to adjust the output signal based on the coarse-tuning voltage and the fine-tuning voltage.

2. The PLL of claim 1 wherein the frequency divide ratio is 2.

3. The PLL of claim 1 wherein the VCO is a ring oscillator having a coarse-tuning port and a fine-tuning port.

4. The PLL of claim 3 wherein the VCO comprises a plurality of pseudo-differential delay stages, which are coupled in series as a closed cycle.

5. The PLL of claim 4 wherein each of the plurality of pseudo-differential delay stages has a positive input terminal, a negative input terminal, a positive output terminal, a negative output terminal, and a control terminal, wherein:
the positive input terminal and the negative input terminal of one of the plurality of pseudo-differential delay stages are coupled to the positive output terminal and the negative output terminal of an adjacent one of the plurality of pseudo-differential delay stages, respectively; and
the control terminal of each of the plurality of pseudo-differential delay stages is coupled to the coarse-tuning port or the fine-tuning port.

6. The PLL of claim 4 wherein the plurality of pseudo-differential delay stages comprises first pseudo-differential delay stages and second pseudo-differential delay stages, wherein:
the control terminal of each first pseudo-differential delay stage is coupled to the coarse-tuning port; and
the control terminal of each second pseudo-differential delay stage is coupled to the fine-tuning port.

7. The PLL of claim 3 further comprising a switch coupled between the SSPD and the VCO, wherein:
when the switch is open, the SSPD is disconnected from the VCO, and the fine-tuning port receives a direct current (DC) voltage;
when the switch is closed, the SSPD is connected to the VCO, and the fine-tuning port receives the fine-tuning voltage; and
the coarse-tuning port receives the coarse-tuning voltage.

8. The PLL of claim 1 wherein the frequency detector comprises a compensate frequency divider, a frequency controller, a digital-to-analog converter (DAC), and a DAC capacitor, wherein:
the compensate frequency divider divides the divided signal to generate a fully divided signal fed to the frequency controller;
the frequency controller is configured to compare the fully divided signal with the reference signal to generate frequency error codes to control the DAC;
the DAC is configured to provide the coarse-tuning voltage based on the frequency error codes; and
the DAC capacitor is coupled between the DAC and ground to minimize the noise from resistors inside the DAC.

9. The PLL of claim 8 wherein the DAC capacitor is a metal-oxide semiconductor (MOS) capacitor.

10. The PLL of claim 8 wherein the DAC capacitor has a capacitance between 0.5 pF and 2 pF.

11. The PLL of claim 8 wherein the frequency controller is off-chip.

12. The PLL of claim 8 wherein the frequency controller is on-chip.

13. The PLL of claim 1 wherein the controlled slope buffer is a current-starved delay stage including a current source, a first P-type metal-oxide-semiconductor (PMOS) transistor, a second PMOS transistor, a third PMOS transistor, a NMOS transistor, and a buffer capacitor, wherein:
the current source is coupled between a drain of the first PMOS transistor and ground;
sources of the first PMOS transistor and the second PMOS transistor are coupled to a supply voltage, and gates of the first PMOS transistor and the second PMOS transistor are coupled together;
a drain of the second PMOS transistor is coupled to a source of the third PMOS transistor;
gates of the third PMOS transistor and the NMOS transistor are coupled together and configured to receive the divided signal;
drains of the third PMOS transistor and the NMOS transistor are coupled together and configured to provide the buffered divided signal;
a source of the NMOS transistor is coupled to ground; and
the buffer capacitor is coupled between the drain of the NMOS and ground.

14. The PLL of claim 13 wherein the second PMOS transistor is a size variable transistor.

15. The PLL of claim 1 wherein the SSPD comprises a first switch, a first capacitor with a first capacitance, a unit-gain buffer, a non-overlap generator, a second switch, and a second capacitor with a second capacitance, wherein:
the first switch is configured to sub-sample the buffered divided signal onto the first capacitor providing a sampled voltage, wherein the first switch is controlled by the reference signal;
the unit-gain buffer is configured to receive the sampled voltage and generate a buffered sampled voltage;
the non-overlap generator is configured to generate a non-overlap clock based on the reference signal, wherein the non-overlap clock and the reference signal have a same frequency, and are never overlapped with each other; and
the second switch is configured to sample the buffered sampled voltage onto the second capacitor providing the fine-tuning voltage, wherein the second switch is controlled by the non-overlap clock.

16. The PLL of claim 15 wherein the unit-gain buffer is formed by an operational amplifier (op-amp).

17. The PLL of claim 15 wherein the non-overlap generator is configured to generate an inverted reference signal and a delayed reference signal from the reference signal, and combine the inverted reference signal with the delayed reference signal to provide the non-overlap clock, wherein:
the inverted reference signal and the delayed reference signal have a same frequency as the reference signal; and
the inverted reference signal has an opposite phase to the reference signal, and the delayed reference signal has a delayed phase compared to the reference signal.

18. The PLL of claim 16 wherein the first capacitance is between 50 fF and 100 fF, and the second capacitance is between 2 pF and 3 pF.

19. A phase-locked loop (PLL) comprising:
a frequency detector, which is configured to receive a reference signal and an output signal, and generate a coarse-tuning voltage, wherein the coarse-tuning voltage indicates a frequency difference between the reference signal and the output signal;
a sub-sampling phase detector (SSPD), which is configured to sub-sample the output signal using the reference signal, and generate a fine-tuning voltage, wherein:
the SSPD comprises a first switch, a first capacitor, a unit-gain buffer, a non-overlap generator, a second switch, and a second capacitor;
the first switch is configured to sub-sample the output signal onto the first capacitor providing a sampled voltage, wherein the first switch is controlled by the reference signal;
the unit-gain buffer is configured to receive the sampled voltage and generate a buffered sampled voltage;
the non-overlap generator is configured to generate a non-overlap clock based on the reference signal, wherein the non-overlap clock and the reference signal have a same frequency, and are never overlapped with each other;
the second switch is configured to sample the buffered sampled voltage onto the second capacitor providing the fine-tuning voltage, wherein the second switch is controlled by the non-overlap clock; and
the fine-tuning voltage indicates a phase difference between the reference signal and the output signal; and
a voltage-controlled oscillator (VCO), which is configured to adjust the output signal based on the coarse-tuning voltage and the fine-tuning voltage.

20. A phase-locked loop (PLL) comprising:
a frequency divider, which is configured to receive an output signal and generate a divided signal by frequency dividing the output signal with a frequency divide ratio;
a frequency detector, which is configured to receive a reference signal and the divided signal, and generate a coarse-tuning voltage, wherein the coarse-tuning voltage indicates a frequency difference between the reference signal and the divided signal;
a sub-sampling phase detector (SSPD), which is configured to sub-sample the divided signal using the reference signal, and generate a fine-tuning voltage, wherein:
the SSPD comprises a first switch, a first capacitor, a unit-gain buffer, a non-overlap generator, a second switch, and a second capacitor;
the first switch is configured to sub-sample the divided signal onto the first capacitor providing a sampled voltage, wherein the first switch is controlled by the reference signal;
the unit-gain buffer is configured to receive the sampled voltage and generate a buffered sampled voltage;
the non-overlap generator is configured to generate a non-overlap clock based on the reference signal, wherein the non-overlap clock and the reference signal have a same frequency, and are never overlapped with each other;
the second switch is configured to sample the buffered sampled voltage onto the second capacitor providing the fine-tuning voltage, wherein the second switch is controlled by the non-overlap clock; and
the fine-tuning voltage indicates a phase difference between the reference signal and the divided signal; and
a voltage-controlled oscillator (VCO), which is configured to adjust the output signal based on the coarse-tuning voltage and the fine-tuning voltage.

21. A phase-locked loop (PLL) comprising:
a frequency detector, which is configured to receive a reference signal and an output signal, and to generate a coarse-tuning voltage, wherein the coarse-tuning voltage indicates a frequency difference between the reference signal and the output signal;
a controlled slope buffer configured to receive the output signal and generate a buffered signal, wherein:
the buffered signal and the output signal have a same frequency; and
the buffered signal has a higher slope and shorter rising time than the output signal;
a sub-sampling phase detector (SSPD), which is configured to sub-sample the buffered signal using the reference signal, and to generate a fine-tuning voltage, wherein the fine-tuning voltage indicates a phase difference between the reference signal and the buffered signal; and
a voltage-controlled oscillator (VCO), which is configured to adjust the output signal based on the coarse-tuning voltage and the fine-tuning voltage.

* * * * *